(12) United States Patent
Umezawa

(10) Patent No.: US 11,824,003 B2
(45) Date of Patent: Nov. 21, 2023

(54) SEMICONDUCTOR DEVICE

(71) Applicant: KIOXIA CORPORATION, Tokyo (JP)

(72) Inventor: Takaco Umezawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 143 days.

(21) Appl. No.: 17/103,752

(22) Filed: Nov. 24, 2020

(65) Prior Publication Data

US 2021/0074637 A1  Mar. 11, 2021

Related U.S. Application Data

(63) Continuation of application No. 16/286,536, filed on Feb. 26, 2019, now Pat. No. 10,886,221.

(30) Foreign Application Priority Data

Sep. 14, 2018 (JP) ................. 2018-172794

(51) Int. Cl.
| | | |
|---|---|---|
| H01L 23/528 | (2006.01) |
| H01L 23/522 | (2006.01) |
| H10B 41/27 | (2023.01) |
| H10B 41/35 | (2023.01) |
| H10B 41/41 | (2023.01) |
| H10B 43/27 | (2023.01) |
| H10B 43/35 | (2023.01) |
| H10B 43/40 | (2023.01) |

(52) U.S. Cl.
CPC ...... *H01L 23/5283* (2013.01); *H01L 23/5226* (2013.01); *H10B 41/27* (2023.02); *H10B 41/35* (2023.02); *H10B 41/41* (2023.02); *H10B 43/27* (2023.02); *H10B 43/35* (2023.02); *H10B 43/40* (2023.02)

(58) Field of Classification Search
CPC ............ H01L 23/5283; H01L 23/5226; H01L 27/11524; H01L 27/11529; H01L 27/11556; H01L 27/1157; H01L 27/11573; H01L 27/11582; H10B 41/27; H10B 41/35; H10B 41/41; H10B 43/27; H10B 43/35; H10B 43/40
See application file for complete search history.

(56) References Cited

U.S. PATENT DOCUMENTS

| | | |
|---|---|---|
| 2011/0233505 A1 | 9/2011 | Nitta |
| 2011/0248380 A1 | 10/2011 | Yoshihara et al. |
| 2012/0200751 A1* | 8/2012 | Kato ................ H01L 27/14621 |
| | | 348/294 |
| 2013/0249113 A1 | 9/2013 | Baba |

(Continued)

FOREIGN PATENT DOCUMENTS

| | | |
|---|---|---|
| CN | 103325807 A | 9/2013 |
| CN | 107017260 A | 8/2017 |
| TW | 201728235 A | 8/2017 |

*Primary Examiner* — Brook Kebede
(74) *Attorney, Agent, or Firm* — Kim & Stewart LLP

(57) ABSTRACT

A semiconductor device includes a first wiring extending in a first direction and a second wiring extending in a second direction crossing the first direction and having an end that faces the first wiring and is a predetermined distance away from the first wiring. The predetermined distance is approximately equal to a width of the second wiring, and the end of the second wiring is formed into one or more loops.

62 Claims, 7 Drawing Sheets

(56) References Cited

U.S. PATENT DOCUMENTS

2014/0332979 A1 11/2014 Cicalo et al.
2016/0163374 A1 6/2016 Koyama et al.
2017/0213845 A1 7/2017 Baba

* cited by examiner

SEMICONDUCTOR DEVICE

CROSS-REFERENCE TO RELATED APPLICATIONS

This application is a continuation of U.S. patent application Ser. No. 16/286,536, filed Feb. 26, 2019, now U.S. Pat. No. 10,886,221, issed Jan. 5, 2021, which is based upon and claims the benefit of priority from Japanese Patent Application No. 2018-172794, filed Sep. 14, 2018, the entire contents of each of which are incorporated herein by reference.

FIELD

Embodiments described herein relate generally to a semiconductor device.

BACKGROUND

Various types of semiconductor devices that are capable of storing data in a non-volatile manner are known. Such semiconductor devices include a semiconductor storage device. Recent semiconductor storage devices tend to have narrower wiring intervals.

DETAILED DESCRIPTION

Embodiments provide a wiring structure for a wiring layer that reduces a magnitude of a trailing phenomenon in the wiring layer.

In general, according to one embodiment, a semiconductor device includes a first wiring extending in a first direction and a second wiring extending in a second direction crossing the first direction and having an end that faces the first wiring and is a predetermined distance away from the first wiring. The predetermined distance is approximately equal to a width of the second wiring, and the end of the second wiring is formed into one or more loops.

Hereinafter, embodiments of the present disclosure will be described with reference to the drawings.

[1] Embodiment

[1-1] Structure of Semiconductor Storage Device 1

[1-1-1] Overall Configuration of Semiconductor Storage Device 1

Figure 1:
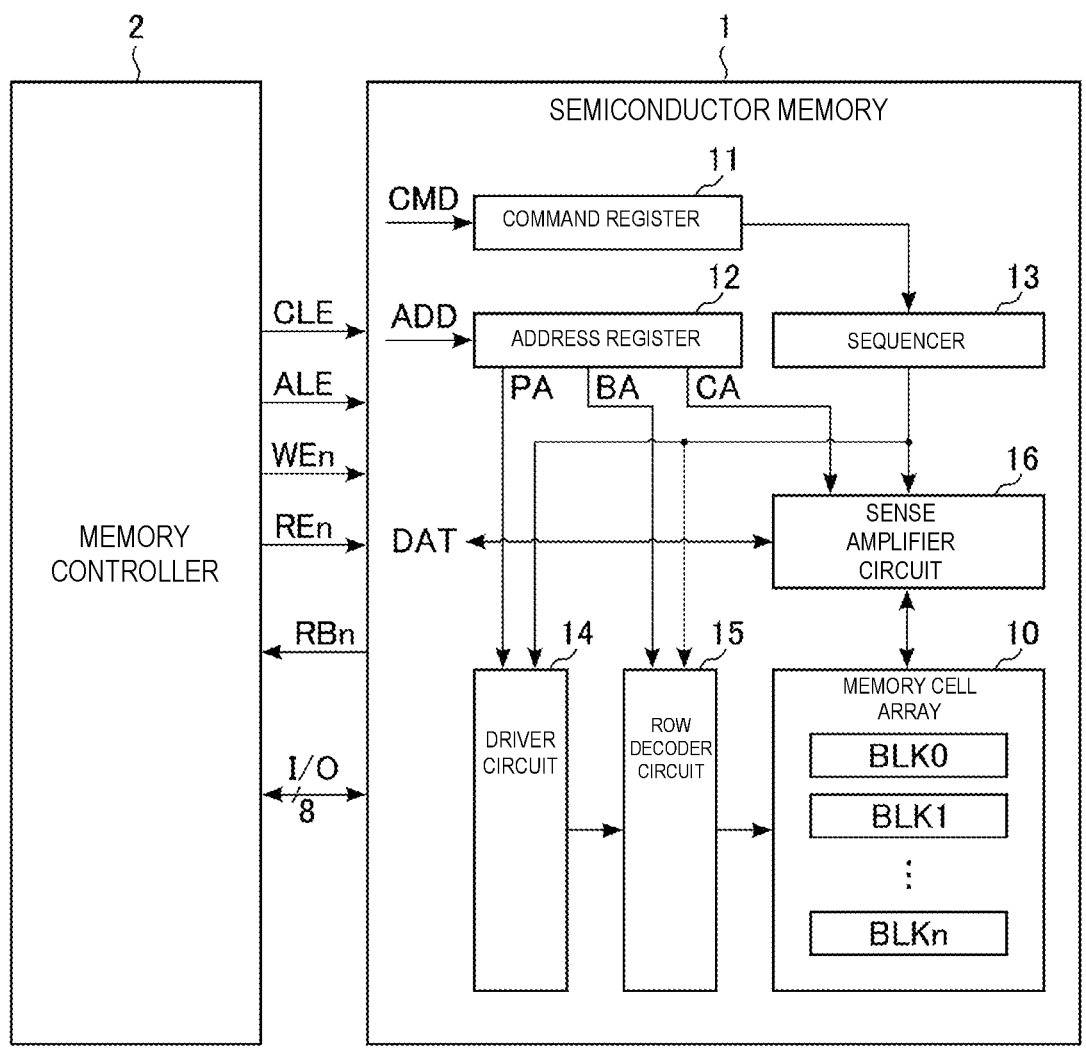
FIG. 1 illustrates an example of an overall configuration of a semiconductor storage device according to an embodiment.

FIG. 1 illustrates an example of an overall configuration of a semiconductor storage device according to an embodiment. A semiconductor storage device 1 is, for example, a NAND flash memory that is capable of storing data in a non-volatile manner. The semiconductor storage device 1 is controlled by an external memory controller 2, for example.

As illustrated in FIG. 1, the semiconductor storage device 1 includes, for example, a memory cell array 10, a command register 11, an address register 12, a sequencer 13, a driver circuit 14, a row decoder circuit 15, and a sense amplifier circuit 16.

The memory cell array 10 includes multiple blocks BLK0 to BLKn (n is an integer of 1 or greater). The block BLK is a set of nonvolatile memory cells and is, for example, unit of data erasure. Pieces of data written in the same block BLK are collectively erased, for example. Each of the memory cells has one bit line and one word line. Details of the structure of the memory cell array 10 are described later.

The command register 11 stores a command CMD that is received from the memory controller 2. The command CMD contains a command that causes the sequencer 13 to execute an operation such as a read operation, a write operation, or an erase operation.

The address register 12 stores address information ADD that is received from the memory controller 2. The address information ADD contains, for example, a block address BA, a page address PA, and a column address CA. The block address BA is used, for example, for selecting a block BLK. The page address PA is used, for example, for selecting a word line. The column address CA is used, for example, for selecting a bit line.

The sequencer 13 controls the entire operation of the semiconductor storage device 1. For example, the sequencer 13 controls the driver circuit 14, the row decoder circuit 15, and the sense amplifier circuit 16 on the basis of the command CMD stored in the command register 11, to execute operations such as the read operation, the write operation, and the erase operation.

The driver circuit 14 generates a voltage to be used in an operation such as the read operation, the write operation, or the erase operation. Moreover, the driver circuit 14 selects a word line corresponding to the page address PA that is stored in the address register 12, with respect to each of the blocks BLK. Then, the driver circuit 14 applies the generated voltage to a word line that is selected by the row decoder circuit 15.

The row decoder circuit 15 selects one block BLK on the basis of the block address BA stored in the address register 12. Plural voltages are applied by the driver circuit 14. Among these voltages, the row decoder circuit 15 transfers the voltage applied to the selected block BLK to the memory cell array 10.

The sense amplifier circuit 16 receives write data DAT from the memory controller 2, and the sense amplifier circuit 16 applies a voltage corresponding to the write data DAT to a corresponding bit line in the write operation. The sense amplifier circuit 16 evaluates data that is stored in the memory cell, on the basis of the voltage of the bit line, and transfers the evaluation result to the memory controller 2 as read data DAT, in the read operation.

The communication between the semiconductor storage device 1 and the memory controller 2 supports, for example, a NAND flash interface specification. For example, the communication between the semiconductor storage device 1 and the memory controller 2 uses a command latch enable signal CLE, an address latch enable signal ALE, a write enable signal WEn, a read enable signal REn, a ready/busy signal RBn, and an input/output signal I/O.

The command latch enable signal CLE indicates that an input/output signal I/O received by the semiconductor storage device 1 is a command CMD. The address latch enable signal ALE indicates that an input/output signal I/O received by the semiconductor storage device 1 is address information ADD. The write enable signal WEn is a signal for instructing the semiconductor storage device 1 that an input/output signal I/O will be input thereto. The read enable signal REn is a signal for instructing the semiconductor storage device 1 to output an input/output signal I/O.

The ready/busy signal RBn is a signal that notifies the memory controller 2 of a ready state or a busy state of the semiconductor storage device 1. The semiconductor storage device 1 accepts an instruction from the memory controller 2 when it is in the ready state, whereas the semiconductor storage device 1 does not accept an instruction from the memory controller 2 when it is in the busy state. The input/output signal I/O is, for example, an 8-bit width signal, and may contain a command CMD, address information ADD, data DAT, or other information.

The semiconductor storage device 1 and the memory controller 2 may be integrated into one semiconductor device. Such a semiconductor device may include a memory card, such as an SD™ card, and a solid state drive (SSD).

[1-1-2] Circuit Structure of Semiconductor Storage Device 1

Figure 2:
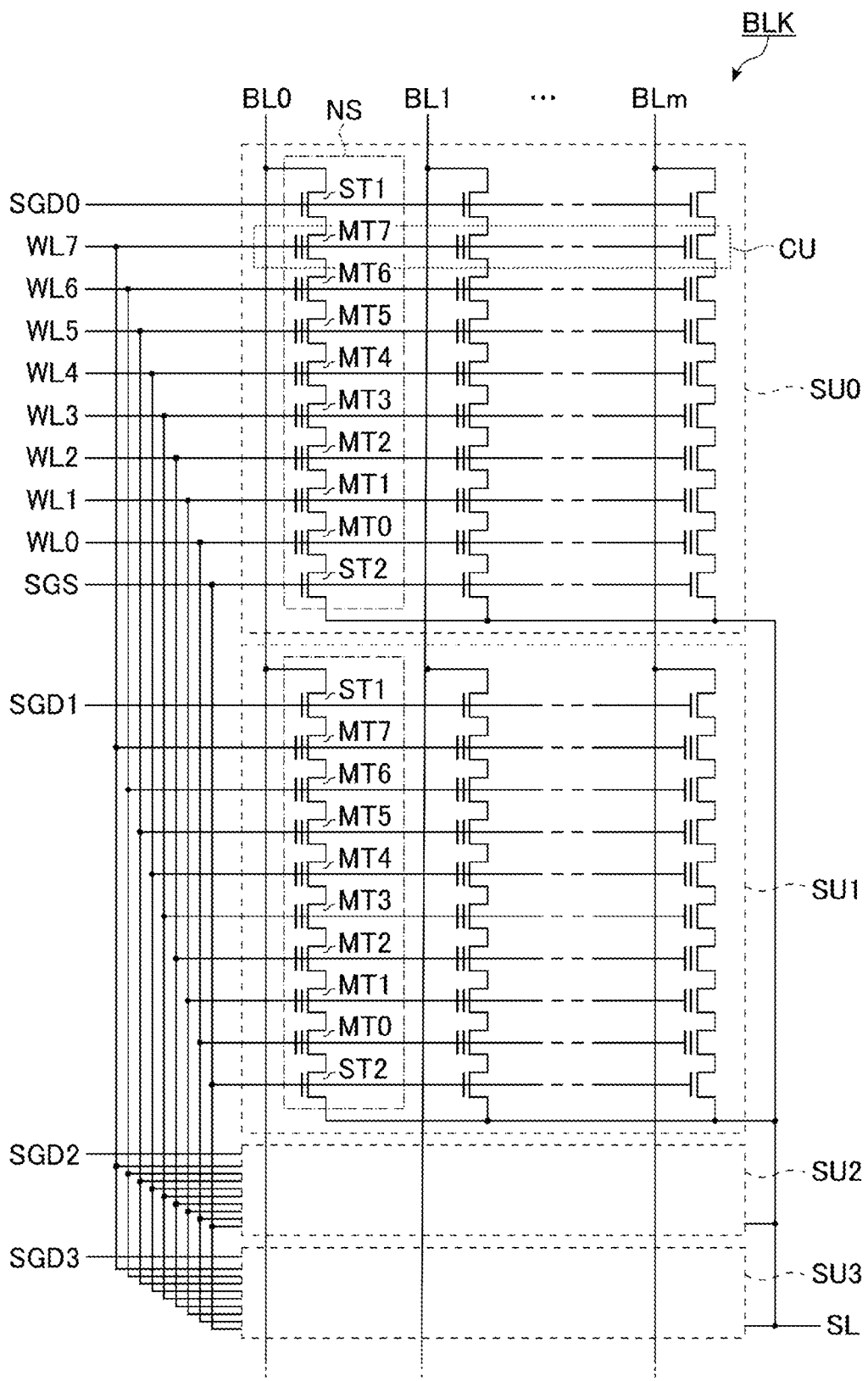
FIG. 2 illustrates an example of a circuit structure of a memory cell array of the semiconductor storage device according to the embodiment.

FIG. 2 illustrates an example of a circuit structure of the memory cell array 10 of the semiconductor storage device 1 according to the embodiment. FIG. 2 selectively illustrates a circuit structure of one of the multiple blocks BLK in the memory cell array 10.

As illustrated in FIG. 2, the block BLK includes, for example, four string units SU0 to SU3. The string units SU0 to SU3 respectively include multiple NAND strings NS that are respectively associated with bit lines BL0 to BLm (m is an integer of 1 or greater).

The NAND string NS includes, for example, 8 memory cell transistors MT0 to MT7 and select transistors ST1 and ST2.

The memory cell transistors MT0 to MT7 each have a control gate and a charge storage layer and each store data in a non-volatile manner. Each of the select transistors ST1 and ST2 is used to select a string unit SU in each of various kinds of operations.

In each of the NAND strings NS, the memory cell transistors MT0 to MT7 are serially connected between a source of the select transistor ST1 and a drain of the select transistor ST2. The memory cell transistors MT0 to MT7 in the same block BLK respectively have control gates that are jointly connected to corresponding word lines WL0 to WL7.

A gate of the select transistor ST1 of each of the string units SU0 to SU3 in the same block BLK is connected to corresponding select gate lines SGD0 to SGD3. Drains of the select transistors ST1 in the same column of the multiple blocks BLK are jointly connected to corresponding bit lines BL0 to BLm.

Gates of the select transistors ST2 in the same block BLK are jointly connected to a select gate line SGS. Sources of the select transistors ST2 of the multiple blocks BLK are jointly connected to a source line SL.

The multiple memory cell transistors that are connected to the same word line in one string unit SU constitute a cell unit. Each of the cell units has a storage capacity that varies depends on the number of bits of data stored in the memory cell transistors. In one example, when the cell unit is composed of memory cell transistors that respectively store 1-bit data, the total amount of data stored in the cell unit is defined as "1-page data". In this case, one cell unit is capable of storing 1-page data when each of the memory cell transistors stores 1-bit data, and one cell unit is capable of storing 2-page data when each of the memory cell transistors stores 2-bit data.

The memory cell array 10 of the semiconductor storage device 1 according to the embodiment is not limited to the structure described above. For example, the numbers of the memory cell transistors and the select transistors ST1 and ST2 in each of the NAND strings NS may be any number. In addition, the number of the string units SU in each of the blocks BLK may be any number.

[1-1-3] Cross Sectional Structure of Semiconductor Storage Device 1

Figure 3:
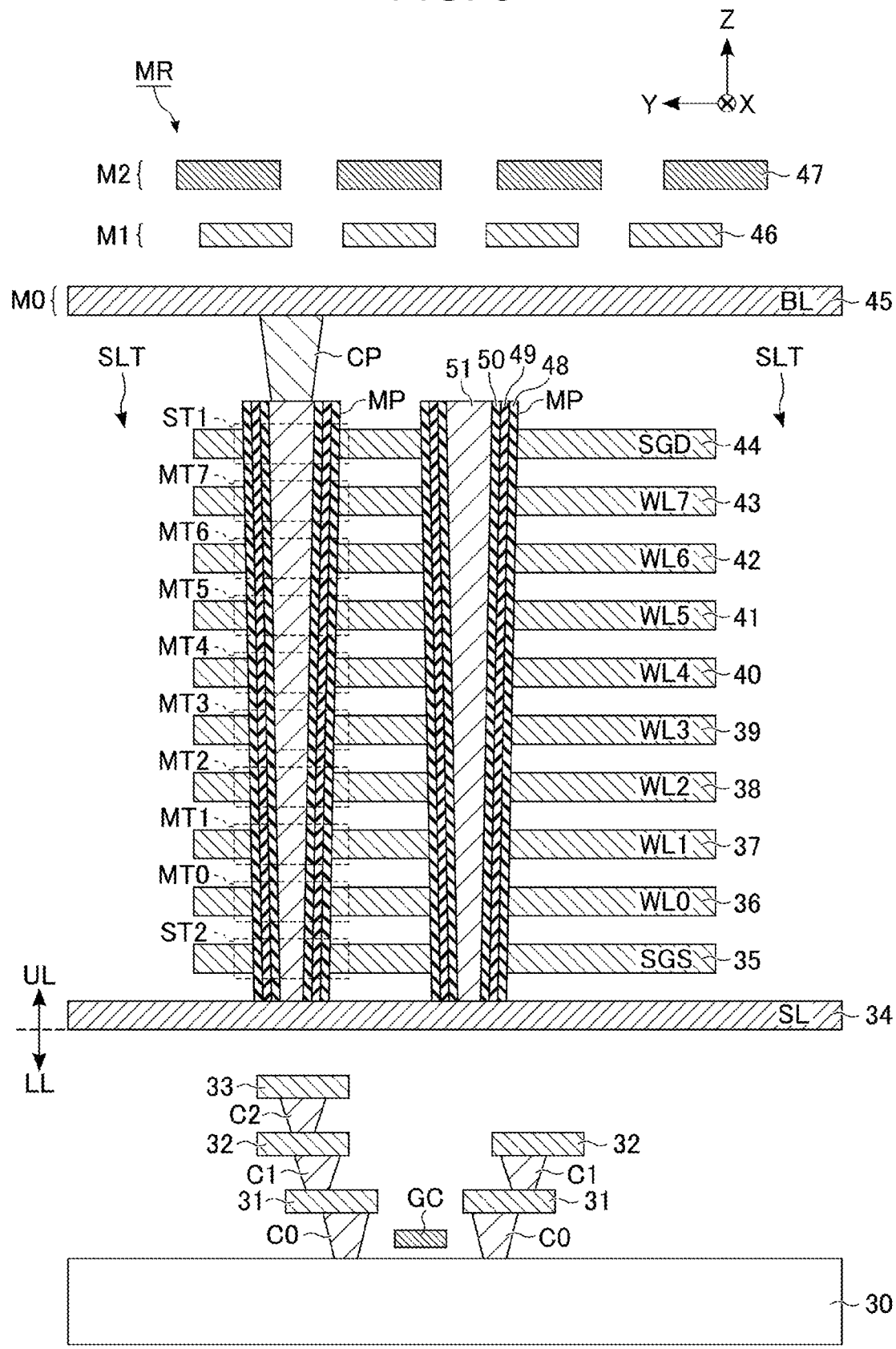
FIG. 3 illustrates an example of a cross sectional structure of the semiconductor storage device according to the embodiment.

FIG. 3 illustrates an example of a cross sectional structure of the semiconductor storage device 1 according to the embodiment. FIG. 3 illustrates an X-direction and a Y-direction, which are parallel to a substrate, such as a semiconductor substrate, and are orthogonal to each other. FIG. 3 also illustrates a Z-direction, which is perpendicular to the substrate, that is, a stacked direction.

As illustrated in FIG. 3, the semiconductor storage device 1 includes, for example, a semiconductor substrate 30, conductors 31 to 47, memory pillars MP, and contacts C0, C1, C2, and CP. The semiconductor substrate 30 has P-type or N-type well regions that are formed on an upper surface part thereof, an impurity diffusion region that is formed in each of the well regions, and an element isolation region between the well regions to insulate the well regions from each other. These regions are not illustrated in FIG. 3.

The semiconductor substrate 30 has, for example, multiple contacts C0 that are provided thereon. The multiple contacts C0 are brought into contact with the impurity diffusion regions (not shown), which are provided on the semiconductor substrate 30. Each of the contacts C0 has the conductor 31 provided thereon. For example, a gate electrode GC is provided in a region between adjacent conductors 31. In this case, one of the adjacent conductors 31 serves as a drain of the transistor, whereas the other serves as a source of the transistor.

Each of the conductors 31 has, for example, the contact C1 provided thereon. Each of the contacts C1 has the conductor 32 provided thereon. The conductor 32 has, for example, the contact C2 provided thereon. The contact C2 has, for example, the conductor 33 provided thereon.

A circuit having the conductors 31 to 33 is provided in the sense amplifier circuit 16, for example. Layers that are provided with the conductors 31 to 33 are provided in a lower layer part LL of the semiconductor storage device 1.

The conductor 33 has the conductor 34 that is provided thereabove via an interlayer insulating film. For example, the conductor 34 is formed in a sheet shape parallel to an XY plane and corresponds to the source line SL. To avoid complicating the drawing, multiple interlayer insulating films are not hatched in FIG. 3.

The conductor 34 has the conductors 35 to 44 sequentially stacked thereabove. The conductors that are adjacent in the Z direction among the conductors 35 to 44 have an interlayer insulating film provided therebetween. The conductors 35 to 44 are conductors for one string unit.

The structure corresponding to one string unit is provided between slits SLT. The slit SLT extends, for example, in the X-direction and in the Z-direction. The slit SLT is made of an insulating material and is between the set of conductors 35 to 44 of one string unit and the set of conductors 35 to 44 of another string unit (not shown) to insulate the two sets of conductors.

Each of the conductors 35 to 44 is formed in a sheet shape parallel to the XY plane, for example. In one example, the conductor 35 corresponds to the select gate line SGS, the conductors 36 to 43 respectively correspond to the word lines WL0 to WL7, and the conductor 44 corresponds to one of the select gate lines SGD0 to SGD3.

The memory pillar MP has a columnar shape that penetrates each of the conductors 35 to 44 and is brought into contact with the conductor 34. The memory pillar MP includes, for example, a block insulating film 48, an insulating film 49, a tunnel oxide film 50, and a semiconductor material 51.

The block insulating film 48 is provided on the inner surface of a memory hole that is formed in a manufacturing process of the semiconductor storage device 1. The block insulating film 48 has an inner surface on which the insulating film 49 is provided. The insulating film 49 functions as a charge storage layer of the memory cell transistor. The insulating film 49 has an inner surface on which the tunnel oxide film 50 is provided. The tunnel oxide film 50 has an inner surface on which the semiconductor material 51 is provided. The semiconductor material 51 contains an electrically conductive material and corresponds to a current path of the NAND string NS. Another insulating member may be formed as a core material at the center portion of the semiconductor material 51.

Multiple conductors 45 are provided above an upper surface of the memory pillar MP via an interlayer insulating film. For example, the conductors 45 are formed in a line shape extending in the Y-direction and are arranged side-by-side in the X-direction, and the conductors 45 correspond to the bit lines BL. Each of the conductors 45 is electrically connected to the corresponding memory pillar MP via the contact CP. This structure is just one example, and the conductor 45 may be connected to the memory pillar MP via parts such as multiple contacts and wirings.

A circuit having the conductors 34 to 44 is provided in, for example, the memory cell array 10. Layers that are provided with the conductors 34 to 44 are provided in the upper layer part UL of the semiconductor storage device 1.

The conductor 46 is provided over a layer having the conductor 45, via an interlayer insulating film. The conductor 47 is provided over a layer having the conductor 46, via an interlayer insulating film. The conductors 46 and 47 correspond to wirings for connecting, for example, the memory cell array 10 and a peripheral circuit, such as the sense amplifier circuit 16, provided under the memory cell array 10. The conductors 46 and 47 may be connected to each other by a columnar contact. The layer having the conductor 45 is referred to as a wiring layer M0, the layer having the conductor 46 is referred to as a wiring layer M1, and the layer having the conductor 47 is referred to as a wiring layer M2, in the following descriptions.

The conductor 46 that is provided in the wiring layer M1 is formed by wiring using metal in a damascene process, for example. The metal for the conductor 46 is, for example, copper (Cu).

On the other hand, the conductor 47 that is provided in the wiring layer M2 is formed into wiring using metal in reactive ion etching (RIE), for example. The metal for the conductor 47 is, for example, aluminum (Al). The conductor 47 may also include a barrier film that is provided on the upper surface or bottom surface or both of a metal layer made of aluminum, for example. In one example, the barrier film may be titanium nitride (TiN).

[1-2] Wiring Structure of Wiring Layer M2

The wiring structure of the wiring layer M2 is described. As described above, the wiring of the wiring layer M2 is formed by RIE. In forming the wiring by RIE, a trailing phenomenon may occur. The trailing phenomenon is a phenomenon that causes the lower part of a wiring to extend, becoming wider than the upper part of the wiring.

Figure 4:
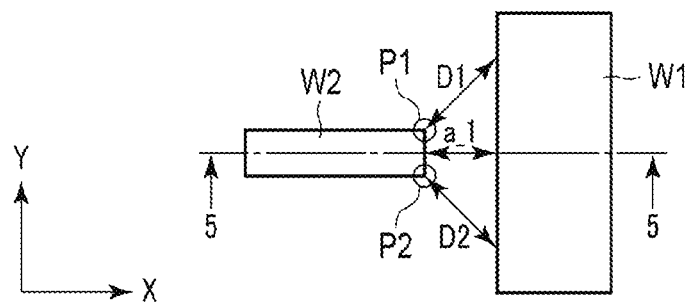
FIGS. 4-5 are views depicting a trailing phenomenon.

For example, wiring may be formed by RIE in a layout illustrated in FIG. 4. FIG. 4 illustrates an example of a wiring structure of the wiring layer M2, which extends in the XY plane, as viewed from above in the Z direction. The wiring layer M2 illustrated in FIG. 4 has a first wiring W1 that extends in the Y-direction and a second wiring W2 that extends in the X-direction. In the example illustrated in FIG. 4, the second wiring W2 is perpendicular to the first wiring W1.

Figure 5:
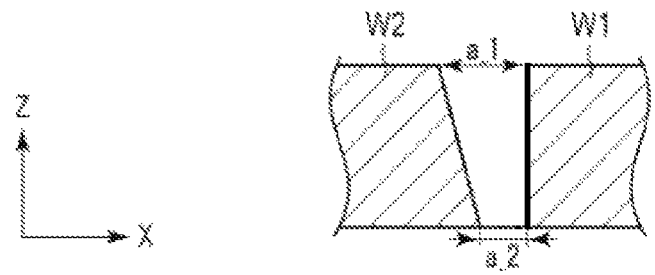

FIG. 5 illustrates a cross section taken along a line 5-5 in FIG. 4. When a trailing phenomenon occurs, lower parts of the wirings extend wider than upper parts of the wirings. The size of the trailing tends to increase at an end point of the wiring, for example. In the present disclosure, the "end point" of the wiring is, for example, a point at a terminal end of the wiring in the wiring extending direction and in the wiring width direction that is perpendicular to the wiring extending direction. For example, in the case of the second wiring W2, the wiring extending direction is the X-direction, and the wiring width direction is the Y-direction. In addition, the size of the trailing tends to be greater at a part with a small wiring density rather than a part with a large wiring density. The size of the trailing also tends to increase at a part with a low wiring regularity rather than a part with a high wiring regularity. For example, in the case in FIG. 4, the size of the trailing tends to increase at end points P1 and P2 of the second wiring W2. The distribution density of the second wiring W2 is smallest at the end points P1 and P2. In addition, the effect of the trailing phenomenon on the second wiring W2 is greater than if it were densely arranged in a pattern with surrounding wirings that are similar to the second wiring W2, i.e., other wirings which have approximately the same width as the second wiring W2 and extends in the X-direction as in the second wiring W2, in the surrounding space of the second wiring W2.

The trailing phenomenon causes the wiring interval $a\_2$ between the lower parts of the wirings to be narrower than the wiring interval $a\_1$ between the upper parts of the wirings. A part with a narrow wiring interval have lower breakdown voltage between the adjacent wirings, thereby easily making a short circuit. In the example in FIG. 4, a short circuit easily occurs in a direction D1 from the end point P1 and in a direction D2 from the end point P2.

Figure 6:
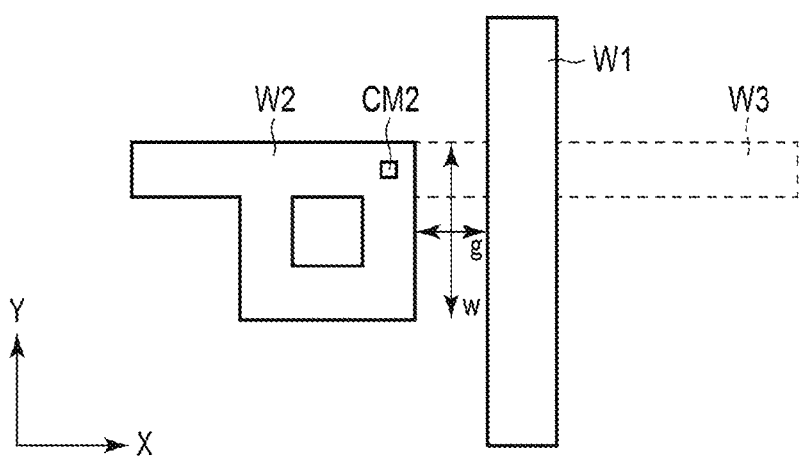
FIG. 6 illustrates an example of a wiring structure of a wiring layer in the semiconductor storage device according to the embodiment.

FIG. 6 illustrates an example of a wiring structure of the wiring layer M2 of the semiconductor storage device according to the embodiment. The wiring structure illustrated in FIG. 6 may be employed at a part of the wiring layer M2 in which lowering of breakdown voltage and generation of a short circuit are expected to occur due to the trailing phenomenon. For example, with regard to wirings in the wiring layer M2 for a peripheral circuit that exists under the memory cell array 10, it is often necessary to lay out the wirings so as to be relatively close to each other. In this case, it is desirable to use the wiring structure illustrated in FIG. 6.

For example, the wiring structure illustrated in FIG. 6 is used when an end of the second wiring W2 is close to the first wiring W1, and a high voltage is to be applied to the second wiring W2. In one example, when the second wiring W2 is laid out so as to cross the first wiring W1, a contact CM2 is formed that connects to the second wiring W2, and the second wiring W2 is connected, via the contact CM2, to a third wiring W3 that is formed in the wiring layer M1. Thus, the second wiring W2 is made to avoid the first wiring W1 by the third wiring W3. In this case, the second wiring W2 and the first wiring W1 are made as close to each other as possible. In this case, the trailing phenomenon tends to occur at an end of the second wiring W2 illustrated in FIG. 6. However, as in the case illustrated in FIG. 4, the trailing phenomenon is unlikely to occur at an end of the first wiring W1 illustrated in FIG. 6.

In this embodiment, the first wiring W1 and the second wiring W2 are "close to each other" when, for example, the wiring interval between the first wiring W1 and the second wiring W2 is 200 nm or smaller in the case where the second wiring W2 has a width of 200 nm. However, when only low voltage is to be applied to the second wiring W2, the wiring structure illustrated in FIG. 6 need not be used even though the wiring interval between the first wiring W1 and the second wiring W2 is 200 nm or smaller. Conversely, it is desirable to employ the wiring structure illustrated in FIG. 6 when a higher voltage is to be applied to the second wiring W2, even though the wiring interval between the first wiring W1 and the second wiring W2 exceeds 200 nm.

In this embodiment, an end of the second wiring W2 is processed to form a loop in order to prevent the trailing phenomenon in the second wiring W2. In the example in FIG. 6, an end of the second wiring W2 forms a rectangular loop. The loop is formed close to where density of wiring around the second wiring W2 is small or close to where regularity of wiring around the second wiring W2 is low or both, from an end point of the second wiring W2. In the example in FIG. 6, on the right side of the second wiring W2 relative to its extending direction along the X-direction, which is the lower side in the drawing, and on the left side of the second wiring W2 relative to its extending direction along the X-direction, which is the upper side in the drawing, there is no other wiring and thus wiring density is small. In view of this, a loop is formed by bending the end of the second wiring W2 to its right or to its left, that is, in a clockwise direction or a counterclockwise direction.

In an example where a wiring interval g between the first wiring W1 and the second wiring W2 is 200 nm, the loop that is formed at the end of the second wiring W2 desirably has a rectangular shape with sides each having a length w of 500 nm or greater, more preferably, 600 nm or greater. For example, the loop of the example in FIG. 6 is a square loop with sides each having a length of 600 nm. The shape of the loop may be a rectangle instead of square.

[1-3] Effects of Embodiment

In the embodiment, the end of the second wiring W2 forms a loop. The end of the second wiring W2 having the loop has no separate end point because each point at the end of the second wiring W2 is not a terminal end in the width direction although they are terminal ends in the extending direction. Moreover, the wiring density at the end of the second wiring W2 is increased, and the wiring regularity is also increased by both sides of the loop. Thus, the trailing phenomenon at the end of the second wiring W2 is prevented. Accordingly, lowering of breakdown voltage and generation of a short circuit between the first wiring W1 and the second wiring W2 are unlikely to occur. In view of this, it is possible to make the wiring interval g between the first wiring W1 and the second wiring W2 smaller than in the case of not forming a loop at the end of the second wiring W2, as in the example in FIG. 4.

In a typical semiconductor device, the thickness of a wiring tends to increase in higher layers, and therefore, forming a wiring with low resistance in a wiring layer is easier in the upper layers. For example, it is desired to decrease the resistance of a power source line to the possible lowest value, and therefore, an upper wiring layer, for example, the wiring layer M2, is used to form the power source line. Meanwhile, it is also preferable to decrease the resistance of wiring other than the power source line, such as a signal line, to the possible lowest value, and thus, a high wiring layer, for example, the wiring layer M2, is preferably used to form such wiring.

For example, when the first wiring W1 is a power source line, and the second wiring W2 is a signal line, the first wiring W1 and the second wiring W2 may cross each other perpendicularly as illustrated in FIG. 4, depending on a circuit design of a semiconductor device. In this case, for example, the first wiring W1 may be extended along the wiring layer M2, and the second wiring W2 may be extended along the wiring layer M2 as close as possible to the first wiring W1 and may be made to have a terminal end that is connected to the underlying third wiring W3 via the contact CM2. This enables decreasing the resistance of the power source line to the lowest value and also decreasing the resistance of the signal line to the possible lowest value, thereby making it possible to optimize performance of the semiconductor device.

In this embodiment, the end of the second wiring W2 forms a loop and thereby can be made close to the first wiring W1 even when the first wiring W1 is a power source line, to which a high voltage is applied.

The loop that is formed at the end of the second wiring W2 has a rectangular shape with sides each having the length w of 500 nm or greater, which is preferably 600 nm or greater. With this structure, the trailing phenomenon at the end of the second wiring W2 is reduced.

In this embodiment, the shape of the second wiring W2 is changed to prevent the trailing phenomenon. According to known and existing methods, the trailing phenomenon at the second wiring W2 may be prevented by providing a dummy wiring which is not applied with voltage or leading out a redundant wiring from another wiring, around the second wiring W2, to increase the wiring density or the wiring regularity at the end of the second wiring W2. Compared with these techniques, this embodiment does not require addition of metal for providing a dummy metal and change of a layout of the other wiring in order to lay out the redundant wiring.

In the technique of providing a dummy wiring and in the technique of obtaining a redundant wiring from another wiring, characteristics of the second wiring W2 tend to be deteriorated due to a parasitic capacitance between the dummy wiring or the redundant wiring and the second wiring W2. In this embodiment, forming the loop at the end of the second wiring W2 enables increasing the wiring density and the wiring regularity at the end of the second wiring W2 without changing the width of the end of the second wiring W2. That is, in this embodiment, an increase in an area of the end of the second wiring W2 is minimized, and thus, an increase in a parasitic capacitance in the second wiring W2 is also minimized.

[2] Modification Examples

The following describes modification examples of the embodiment. A structure similar to the structure of the semiconductor storage device 1 in the embodiment may be used as the structure of the semiconductor storage device 1 of the modification examples. Thus, details of the semiconductor storage device 1 are not repeated. In addition, the same parts as in the embodiment are represented by reference signs similar to those in the embodiment, and details of these parts are not repeated.

[2-1] First and Second Modification Examples

Figure 7A:
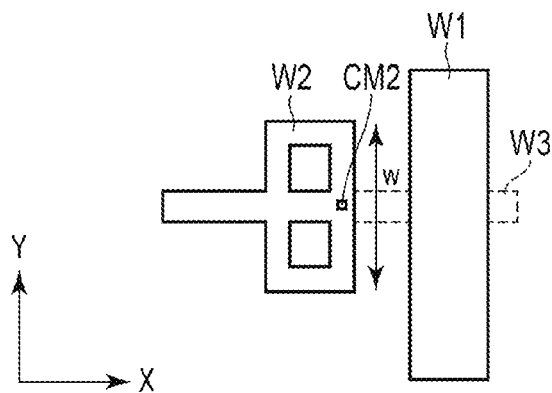
FIG. 7A illustrates a first modification example.
Figure 7B:
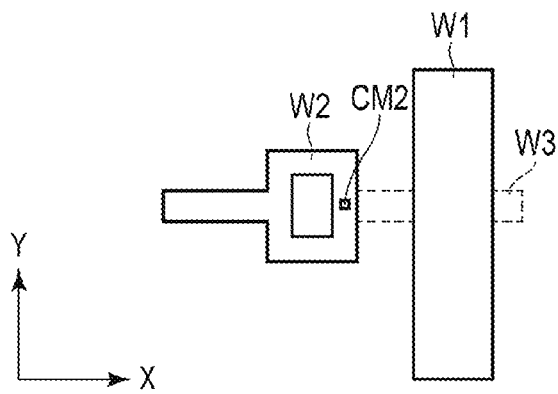
FIG. 7B illustrates a second modification example.

A first modification example is described. In FIG. 6, the end of the second wiring W2 forms one loop. However, as illustrated in FIG. 7, the end of the second wiring W2 may form two or more loops. In the example in FIG. 7, the end of the second wiring W2 forms two loops that are axially symmetric with respect to an axis of a main body of the second wiring W2. In the embodiment, the loop that is formed at the end of the second wiring W2 desirably has sides each having the length w of 500 nm or greater, which is more preferably 600 nm or greater. The length w in the first modification example is the total length of the sides of the two loops.

In FIG. 6, the end of the second wiring W2 forms a loop that is bent in the clockwise direction. However, in a second modification example illustrated in FIG. 7B, the loop may be formed over the axis of the main body.

[2-2] Third Modification Example

Figure 8A:
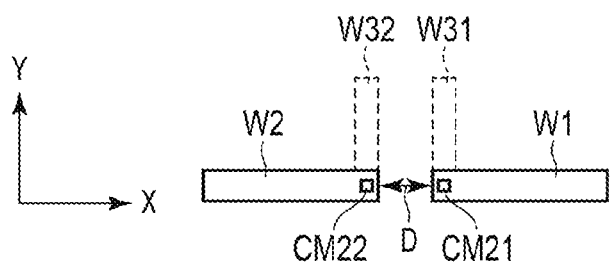
FIGS. 8A and 8B depict a third modification example.

A second modification example is described. In FIG. 6, only the end of the second wiring W2 is processed to form the loop, and the first wiring W1 is subjected to no processing. This is because an end point of the first wiring W1 does not face the second wiring W2, and thus, lowering of breakdown voltage and generation of a short circuit are not expected to occur in the first wiring W1. On the other hand, in a case as illustrated in FIG. 8A, lowering of the breakdown voltage and generation of a short circuit are expected to occur at the end of both the first wiring W1 and the second wiring W2. In this case, the end of the first wiring W1 and the end of the second wiring W2 are arranged close to each other, connecting the first wiring W1 to an underlying third wiring W31 via a contact CM21 and connecting the second wiring W2 to an underlying third wiring W32 via a contact CM22, and a high voltage is to be applied to each of the first wiring W1 and the second wiring W2.

Figure 8B:
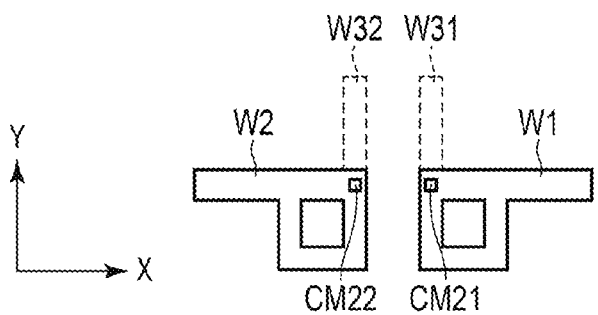

In such a case, as illustrated in FIG. 8B, it is desirable to process the end of the first wiring W1 to form a loop, in addition to the processing of the end of the second wiring W2 to form a loop. This results in preventing the trailing phenomenon at the end of the first wiring W1 as well as the trailing phenomenon at the end of the second wiring W2. In the second modification example, two or more loops may be formed at each of the wirings, and a loop may be formed over the axis of each of the wirings, in a manner similar to that in the first and second modification examples.

[2-3] Fourth Modification Example

Figure 9A:
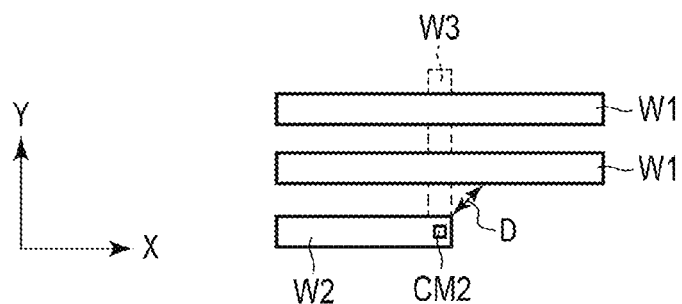
FIGS. 9A and 9B depict a fourth modification example.

A fourth modification example is described. In the embodiment, and the first, second, and third modification examples, the second wiring W2 is perpendicular to the first wiring W1. However, even in a case where the second wiring W2 is arranged parallel to the first wiring W1 as illustrated in FIG. 9A, lowering of breakdown voltage and generation of a short circuit are expected to occur in the D direction due to the trailing phenomenon.

Figure 9B:
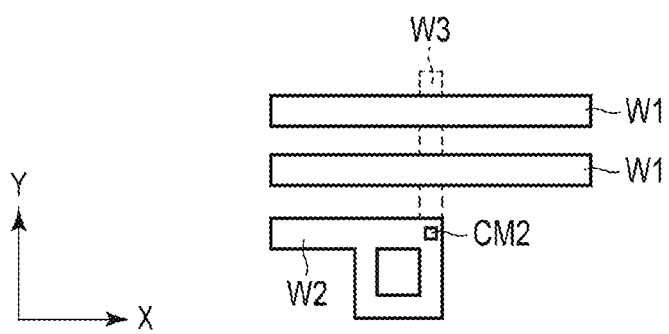

Also in this case, as illustrated in FIG. 9B, the end of the second wiring W2 may be processed to form a loop. The loop is formed in a direction in which the first wirings W1 are not densely arranged. As described above, the trailing phenomenon tends to occur in a direction in which the wiring density is small. Thus, the trailing phenomenon is prevented by forming a loop on a side in which the first wiring W1 is not densely arranged (lower side in FIG. 9B). In the fourth modification example, if there is sufficient space between the first wiring W1 and the second wiring W2, two or more loops may be formed in the second wiring W2, and a loop may be formed over the axis of the second wiring W2, similar to that in the first and second modification examples.

[2-4] Fifth Modification Example

Figure 10A:
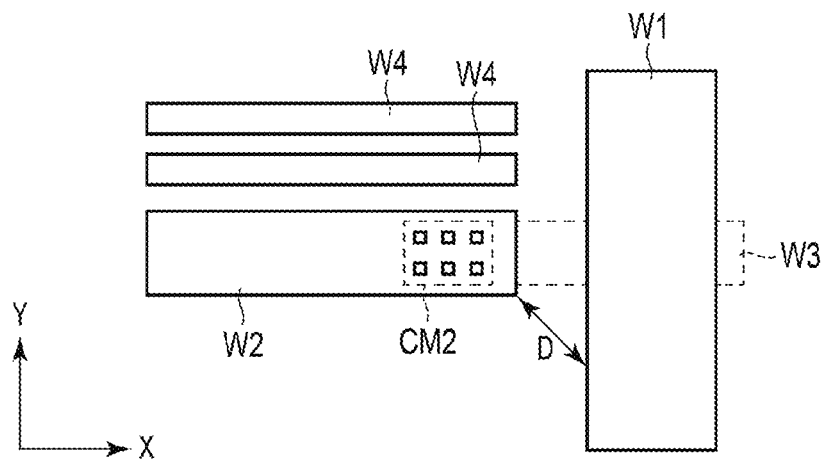
FIGS. 10A and 10B depict a fifth modification example.

A fifth modification example is described. FIG. 10A illustrates multiple fourth wirings W4 that are arranged in parallel to the second wiring W2. Ends of the fourth wirings W4 face the first wiring W1, but are not required to form loops. This is because the aligned multiple fourth wirings W4 increase the wiring density and the wiring regularity around their ends. If a fourth wiring W4 is arranged at an edge, the end of that fourth wiring W4 should be formed into a loop.

As described above, the loop that is formed at the end of the second wiring W2 desirably has sides each having the length w of 500 nm or greater, more preferably 600 nm or greater. In an actual situation, the trailing phenomenon is unlikely to occur in a wiring having a width of 500 nm or greater even in a case where a loop is not formed. The width is preferably 600 nm or greater. In this case, it is not necessary to process the end of the second wiring W2 to form a loop. For example, a wiring having a sufficient width, such as a power source line, does not require the process of forming a loop.

Figure 10B:
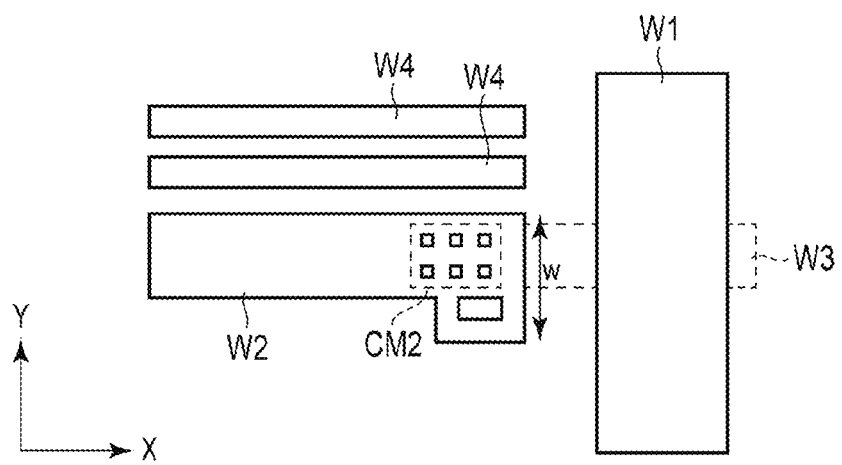

Conversely, even though the second wiring W2 has a certain degree of width, lowering of breakdown voltage and generation of a short circuit are expected to occur at the end point in a case where the width is less than 500 nm. In such a second wiring W2, it is not necessary that a side of a loop has a length of 500 nm or greater or a preferable length of 600 nm or greater. That is, as illustrated in FIG. 6 and FIG. 10B, the length of each side of the loop may be determined so that a total value w of the width of the second wiring W2 and the length of one side of the loop will be 500 nm or greater, preferably, 600 nm or greater.

[2-4] Other Modification Examples

The embodiment and the modification examples of the embodiment describe an example of using the present disclosure in a wiring structure of the semiconductor storage device 1 in which a peripheral circuit is arranged under the memory cell array 10. On the other hand, the semiconductor storage device 1 may also have a known structure in which a peripheral circuit is arranged on one or more sides of the memory cell array 10. The wiring structures of the embodiment and the modification examples of the embodiment may also be used in such a structure that a peripheral circuit is arranged on one or more sides of the memory cell array 10.

In addition to devices such as a semiconductor storage device and a semiconductor device, the wiring structures of the embodiment and the modification examples of the embodiment may also be used in various types of electronic devices with densely arranged multiple wirings that have a part in which lowering of breakdown voltage and generation of a short circuit are expected to occur due to the trailing phenomenon.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first wiring layer and a second wiring layer at different levels over a substrate,
   the first wiring layer including:
     a first wiring extending in a first direction; and
     a second wiring extending in a second direction crossing the first direction and having an end that faces the first wiring and is a predetermined distance away from the first wiring, and
   the second wiring layer including a third wiring, wherein
   the end of the second wiring is formed into two or more rectangular loops having a common side that is contiguous with and extends in the second direction from a main body of the second wiring, and
   a contact is formed at an end of the common side and is formed to electrically connect the second wiring to the third wiring.

2. The semiconductor device according to claim 1, wherein the end of the second wiring is formed into two rectangular loops.

3. The semiconductor device according to claim 1, wherein one of the rectangular loops has sides each having a length of 500 nm or greater.

4. The semiconductor device according to claim 1, wherein the width of the second wiring is 200 nm or less and one of the rectangular loops has sides each having a length of 500 nm or greater.

5. The semiconductor device according to claim 1, wherein the predetermined distance is approximately equal to a width of the second wiring.

6. The semiconductor device according to claim 1, wherein only two of the sides of the rectangular loops face the first wiring and is parallel to the first direction.

7. The semiconductor device according to claim 1, wherein the width of second wiring is maintained constant in the loop.

8. The semiconductor device according to claim 1, wherein the first wiring and the second wiring are formed by reactive ion etching.

9. The semiconductor device according to claim 1, wherein the third wiring is formed by a damascene process.

10. The semiconductor device according to claim 1, wherein the first wiring and the second wiring are each an aluminum wiring.

11. The semiconductor device according to claim 1, wherein the third wiring is a copper wiring.

12. The semiconductor device according to claim 1, wherein one of the first wiring and the second wiring is a power source line.

13. The semiconductor device according to claim 1, wherein a high voltage is applied to one of the first wiring and the second wiring.

14. The semiconductor device according to claim 1, wherein one of the first wiring and the second wiring is a signal line.

15. The semiconductor device according to claim 1, wherein a width of the first wiring is approximately equal to a width of the second wiring.

16. The semiconductor device according to claim 1, wherein a width of the first wiring is larger than a width of the second wiring.

17. The semiconductor device according to claim 1, wherein the third wiring extends parallel to the second direction.

18. The semiconductor device according to claim 1, further comprising:
    a plurality of memory pillars between one of the wiring layers and the substrate, and extending in a third direction crossing the first direction and the second direction.

19. The semiconductor device according to claim 18, wherein each of the memory pillars includes, a charge storage film, a tunnel insulating film, and a semiconductor material.

20. The semiconductor device according to claim 18, further comprising:
    a plurality of slits extending parallel to the third direction and parallel to the second direction,
    wherein the memory pillars are formed between the slits.

21. The semiconductor device according to claim 1, wherein the first wiring layer is above the second wiring layer.

22. The semiconductor device according to claim 1, further comprising:
    a third wiring layer, wherein the second wiring layer is formed between the first wiring layer and the third wiring layer.

23. The semiconductor device according to claim 22, wherein the third wiring layer includes a bit line.

24. The semiconductor device according to claim 23, wherein the bit line extends parallel to the first direction.

25. The semiconductor device according to claim 23, further comprising:
    a fourth wiring layer, wherein the third wiring layer is formed between the second wiring layer and the fourth wiring layer.

26. The semiconductor device according to claim 25, wherein the fourth wiring layer includes a source line.

27. The semiconductor device according to claim 26, further comprising:
    a plurality of memory pillars between the third wiring layer and the fourth wiring layer, and extending in a third direction crossing the first direction and the second direction.

28. The semiconductor device according to claim 27, further comprising:
    a fifth wiring layer between the first wiring layer and the substrate.

29. The semiconductor device according to claim 28, further comprising:
    a sixth wiring layer between the fifth wiring layer and the substrate, and
    a gate electrode layer between the sixth wiring layer and the substrate.

30. The semiconductor device according to claim 29, further comprising:
    a fourth wiring and a fifth wiring in the first wiring layer, wherein an interval between the fourth wiring and the fifth wiring includes a first interval region and a second interval region that are separated from each other in a third direction crossing the first direction and the second direction, and the second interval region is narrower and is closer to the second wiring layer than the first interval region.

31. The semiconductor device according to claim 30, wherein a width of the first wiring is larger than a width of the third wiring, and the third wiring is a copper wiring.

32. The semiconductor device according to claim 31, wherein one of the plurality of memory pillars includes, a charge storage film, a tunnel insulating film, and a semiconductor material.

33. The semiconductor device according to claim 32, wherein the semiconductor material is configured to be a current path of a NAND string.

34. The semiconductor device according to claim 33, wherein a thickness of the first wiring layer is thicker than a thickness of the second wiring layer.

35. The semiconductor device according to claim 34, wherein the bit line extends parallel to the first direction.

36. The semiconductor device according to claim 35, further comprising:
a plurality of slits extending parallel to the third direction and parallel to the second direction,
wherein the memory pillars are formed between the slits.

37. The semiconductor device according to claim 36, further comprising:
a plurality of blocks in a memory cell array; and
at least four select gate lines between the plurality of word lines and the bit line, in one of the blocks.

38. The semiconductor device according to claim 37, wherein one of the rectangular loops has sides each having a length of 600 nm or greater.

39. The semiconductor device according to claim 38, further comprising:
a plurality of contacts electrically connecting the second wiring to the third wiring.

40. The semiconductor device according to claim 39, wherein a width of the second wiring is larger than a width of the contact.

41. The semiconductor device according to claim 40, wherein the semiconductor device is configured to receive a command latch enable signal and an address latch enable signal from a memory controller.

42. The semiconductor device according to claim 1, further comprising:
a fifth wiring layer between the first wiring layer and the substrate.

43. The semiconductor device according to claim 42, further comprising:
a sixth wiring layer between the fifth wiring layer and the substrate, and
a gate electrode layer between the sixth wiring layer and the substrate.

44. The semiconductor device according to claim 1, further comprising:
a fourth wiring and a fifth wiring in the first wiring layer, wherein
an interval between the fourth wiring and the fifth wiring includes a first interval region and a second interval region that are separated from each other in a third direction crossing the first direction and the second direction, and the second interval region is narrower and is closer to the second wiring layer than the first interval region.

45. The semiconductor device according to claim 1, further comprising:
a plurality of wiring layers formed in a memory cell array, and between one of the wiring layers and the substrate.

46. The semiconductor device according to claim 45, wherein the plurality of wiring layers includes a plurality of word lines.

47. The semiconductor device according to claim 46, wherein a sixth wiring in one of the first wiring layer and the second wiring layer is for connecting the memory cell array and a peripheral circuit.

48. The semiconductor device according to claim 1, wherein a width of the first wiring is larger than a width of the third wiring.

49. The semiconductor device according to claim 1, wherein a thickness of the first wiring layer is thicker than a thickness of the second wiring layer.

50. The semiconductor device according to claim 1, further comprising:
a plurality of blocks in a memory cell array; and
at least four select gate lines between plurality of word lines and a bit line, in one of the blocks.

51. The semiconductor device according to claim 1, wherein one of the rectangular loops has sides each having a length of 600 nm or greater.

52. The semiconductor device according to claim 1, further comprising:
a plurality of contacts electrically connecting the second wiring to the third wiring.

53. The semiconductor device according to claim 1, wherein a width of the second wiring is larger than a width of the contact.

54. The semiconductor device according to claim 1, wherein the semiconductor device is configured to receive a command latch enable signal and an address latch enable signal from a memory controller.

55. A memory system comprising:
a semiconductor device and a memory controller,
the semiconductor device including a first wiring layer and a second wiring layer at different levels over a substrate,
the first wiring layer including:
a first wiring extending in a first direction; and
a second wiring extending in a second direction crossing the first direction and having an end that faces the first wiring and is a predetermined distance away from the first wiring, and
the second wiring layer including a third wiring, wherein
the end of the second wiring is formed into two or more rectangular loops having a common side that is contiguous with and extends in the second direction from a main body of the second wiring, and
a contact is formed at an end of the common side and is formed to electrically connect the second wiring to the third wiring.

56. The semiconductor device according to claim 55, wherein communication between the semiconductor device and the memory controller uses a command latch enable signal and an address latch enable signal.

57. The semiconductor device according to claim 55, wherein a width of the first wiring is larger than a width of the third wiring, and the third wiring is a copper wiring.

58. The semiconductor device according to claim 55, wherein one of the plurality of memory pillars includes, a charge storage film, a tunnel insulating film, and a semiconductor material.

59. The semiconductor device according to claim 55, wherein a thickness of the first wiring layer is thicker than a thickness of the second wiring layer.

60. The semiconductor device according to claim 55, wherein the bit line extends parallel to the first direction.

61. The semiconductor device according to claim 55, further comprising:
   a plurality of blocks in a memory cell array; and
   at least four select gate lines between plurality of word lines and a bit line, in one of the blocks.

62. The semiconductor device according to claim 55, further comprising:
   a plurality of contacts electrically connecting the second wiring to the third wiring.

* * * * *